United States Patent
Lee et al.

(10) Patent No.: US 10,103,162 B2
(45) Date of Patent: Oct. 16, 2018

(54) VERTICAL NEUROMORPHIC DEVICES STACKED STRUCTURE AND ARRAY OF THE STRUCTURE

(71) Applicant: SNU R&DB FOUNDATION, Seoul (KR)

(72) Inventors: Jong-Ho Lee, Seoul (KR); Chul-Heung Kim, Seoul (KR); Suhwan Lim, Goyang-si (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 15/220,776

(22) Filed: Jul. 27, 2016

(65) Prior Publication Data

US 2017/0033120 A1    Feb. 2, 2017

Related U.S. Application Data

(60) Provisional application No. 62/198,855, filed on Jul. 30, 2015.

(51) Int. Cl.
| | |
|---|---|
| *H01L 27/11582* | (2017.01) |
| *H01L 27/11575* | (2017.01) |
| *H01L 27/1157* | (2017.01) |
| *H01L 27/11565* | (2017.01) |
| *H01L 27/11573* | (2017.01) |

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11575* (2013.01)

(58) Field of Classification Search
CPC ................. H01L 27/11582; H01L 27/11575
See application file for complete search history.

(56) References Cited

U.S. PATENT DOCUMENTS

| | | | | |
|---|---|---|---|---|
| 2005/0101087 | A1* | 5/2005 | Endoh | H01L 29/7926 438/257 |
| 2009/0180324 | A1* | 7/2009 | Ramaswamy | H01L 27/11575 365/185.17 |
| 2011/0309432 | A1* | 12/2011 | Ishihara | G11C 16/0466 257/324 |
| 2011/0316063 | A1* | 12/2011 | Tang | H01L 27/0688 257/314 |

(Continued)

*Primary Examiner* — Marcos D Pizarro
*Assistant Examiner* — Shannon Yi
(74) *Attorney, Agent, or Firm* — Cantor Colburn LLP

(57) ABSTRACT

Provided is a vertical neuromorphic devices stacked structure comprising a main gate which is formed on a substrate and has a vertical pillar shape, a main gate insulating layer stack formed on outer side surface of the main gate; a semiconductor region formed on outer side surface of the main gate insulating layer stack, a plurality of electrode layers formed on the side surface of the semiconductor region, a plurality of control gates formed on the side surface of the semiconductor region; and a plurality of control gate insulating layer stacks which are surrounding surfaces of the control gates and are formed between the control gate and the semiconductor region, and between the control gate and the electrode layer, and wherein the electrode layers and the control gates surrounded by the control gate insulating layer stack are stacked sequentially and alternately on the side surface of the semiconductor region.

20 Claims, 13 Drawing Sheets

(56) References Cited

U.S. PATENT DOCUMENTS

| | | | | |
|---|---|---|---|---|
| 2013/0044549 A1* | 2/2013 | Goda | ................ | H01L 27/11519 |
| | | | | 365/185.26 |
| 2013/0336070 A1* | 12/2013 | Sakui | .................... | G11C 16/10 |
| | | | | 365/185.22 |
| 2015/0171098 A1* | 6/2015 | Simsek-Ege | ...... | H01L 27/11556 |
| | | | | 257/321 |
| 2016/0284724 A1* | 9/2016 | Rabkin | ............ | H01L 27/11582 |

* cited by examiner

VERTICAL NEUROMORPHIC DEVICES STACKED STRUCTURE AND ARRAY OF THE STRUCTURE

BACKGROUND OF THE INVENTION

1. Field of the Invention

The present invention relates to a vertical neuromorphic devices stacked structure and array of the structure in a neuromorphic technique, more particularly, to a vertical neuromorphic devices stacked structure and array of the structure of which the neuromorphic devices are formed by vertical structure to improve the degree of integration.

2. Description of the Prior Art

Neumann architecture, power consumption has been greatly increased, and the problem of heat release has been very serious. Therefore, in the field of Von-Neumann-based integrated circuits, many approaches to imitate nervous systems of animals have been studied. In particular, in techniques of imitating the nervous systems of animals, the power consumption can be greatly reduced, and perceiving and learning are enabled, so that perception and determination functions can be improved. Accordingly, the functions of existing Von-Neumann-based integrated circuits are expected to be greatly improved or replaced by using the techniques of imitating the nervous systems of animals. Therefore, much attention has been increasingly paid on the techniques of imitating the nervous systems of animals, and there is much need to study techniques of imitating the nervous system of animals.

A basic function of a neuron is to generate an electrical spike (signal) from a stimulus exceeding a threshold value and transmit information to another cell. The generated electrical signal is called an action potential. A neuron may be mainly divided into three portions. Namely, the neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or stimulus receptor cell and transmits the stimulus to another nerve cell or glandular cell. Exchanging stimuli occurs in the synapse. One nerve cell (neuron) receives stimuli through a plurality of the synapses to integrate excitations, and after that, the nerve cell transmits an electrical spike to an axon near to the nerve cell body, so that the electrical spike reaches the synapse.

In this manner, the transmission of excitations from the neuron through the synapse to another nerve cell is referred to as excitation transmitting. The excitation in the synapse is transmitted only in the direction from a nerve fiber to a nerve cell body or a dendrite and is not transmitted in the reverse direction. As a whole, the synapse transmits the excitation only in the one direction.

In addition, the synapse is a relay site of transmitting the excitations, and the synapse applies a weighting factor according to temporal or spatial change of excitations reaching the synapse or make inhibition to enable a high-level integrating function of the nerve system.

On the other hand, besides the synapse which transmits the excitations, there are some synapses having a function of inhibiting the excitations of the nerve cell. The synapse having the function is called an inhibitory synapse. When the excitation transmitted along nerve fiber reaches the inhibitory synapse, the synapse secretes an inhibitory transmitting material. The inhibitory material acts on a membrane of the nerve cell connected to the synapse to inhibit excitations of the cell from occurring (occurrence of an action potential). As a result, while the inhibitory transmitting material acts, the excitation reaching another synapse is not transmitted to the synapse.

In this manner, the neuron performs an excitation transmitting function of transmitting excitations received from one or more nerve cells through the synapse to another nerve cell, an excitation integrating/transmitting function of integrating excitations received from a plurality of nerve cells and transmitting an integrated excitation to another nerve cell, or an excitation inhibiting function of inhibiting an excitation from be transmitted from another nerve cell.

The present invention is to provide a neuromorphic device capable of imitating various functions such as excitation integrating, transmitting, and inhibiting functions performed by the neuron and the synapse.

In the related art, there are mainly memrister-based techniques and SRAM-based techniques. In the memrister-based techniques, an existing RRAM or PRAM is mainly used, and in some cases, an STT-MRAM is used. Since two-terminal elements are basically used, these techniques seem to be simple. However, in implementation of an actual synapse array, complexity of interconnection for the excitatory or inhibitory functionality is greatly increased. In addition, there is a problem in that, as a limitation of the two-terminal element in an array environment, a selection element needs to be installed in each vertical neuromorphic device. In the case of using the RRAM or the PRAM, an analog memory suitable for imitating the functions of the synapse can be implemented. However, in the case of using the SRAM, since the SRAM is a digital memory, there is a limitation to implement one synapse. In particular, the case of using the RRAM has a serious problem in durability, and the case of using the PRAM has a problem in durability and a problem according to high power consumption. Since an existing SRAM cell for imitating the synapse is typically configured with eight transistors, the occupied area is too large, and there is a limitation as a digital memory described above. Therefore, there is a serious problem in degree of integration.

The present invention is to provide a vertical neuromorphic devices stacked structure and array of the structure being capable of having a high degree of integration which are produced by using 3 dimensional stacked procedures used in the 3 dimensional NAND Flash memory technique.

SUMMARY OF THE INVENTION

The present invention is to provide a vertical neuromorphic devices stacked structure and array of the structure capable of having excellent reliability, lower power consumption, and a high degree of integration while solving problems of existing vertical neuromorphic devices.

According to a first aspect of the present invention, there is provided a vertical neuromorphic devices stacked structure comprising: a main gate which is formed on a substrate and has a vertical pillar shape; a main gate insulating layer stack formed on outer surface of the main gate; a semiconductor region formed on outer surface of the main gate insulating layer stack; a plurality of electrode layers formed on the side surface of the semiconductor region; a plurality of control gates formed on the side surface of the semiconductor region; and a plurality of control gate insulating layer stacks which are surrounding surfaces of the control gates and are formed between the control gate and the semiconductor region and between the control gate and the electrode layer. The electrode layers and the control gates surrounded by the control gate insulating layer stack are preferably stacked sequentially and alternately on the side surface of the semiconductor region.

In the vertical neuromorphic devices stacked structure according to the first aspect, preferably, the main gate insulating layer stack is configured with a single insulating material or in a stack structure where a plurality of layers including at least a charge storage layer and an insulating film are stacked.

In the vertical neuromorphic devices stacked structure according to the first aspect, preferably, the control gate insulating layer stack formed between the control gate and the semiconductor region is configured in a stack structure where a plurality of layers including at least a charge storage layer and an insulating film are stacked, and the control gate insulating layer stack formed between the control gate and the electrode layer is configured with a single insulating material or a plurality of insulating layers and does not include a charge storage layer.

In the vertical neuromorphic devices stacked structure according to the first aspect, preferably, the control gate insulating layer stack and the main gate insulating layer stack are configured in a stack structure where a plurality of layers including at least a charge storage layer and an insulating film are stacked, and the charge storage layers of each of the control gate insulating layer stack and the main gate insulating layer stack are different from each other in terms of a charge storage duration.

In the vertical neuromorphic devices stacked structure according to the first aspect, preferably, the electrode layers are configured with semiconductor electrodes doped with impurities of which type is opposite to that of adjacent electrode layers.

In the vertical neuromorphic devices stacked structure according to the first aspect, preferably, the electrode layers are configured with semiconductor electrodes doped with impurities of which type is same with that of adjacent electrode layers, and the structure further includes a doping region which is formed on a side surface of the semiconductor region and is doped with impurities of which type is opposite to that of the electrode layer.

In the vertical neuromorphic devices stacked structure according to the first aspect, preferably, the electrode layers are configured with semiconductor electrodes doped with impurities of which type are same with those of adjacent electrode layers, and the structure further includes a doping region which is formed on a side surface of the semiconductor region and is doped with impurity of which type is opposite to that of the electrode layer.

In the vertical neuromorphic devices stacked structure according to the first aspect, preferably, in the case where the main gate insulating layer stack includes a charge storage layer and an insulating film, a program or erase operation is performed by injecting carriers (electrons or holes) from the main gate or the semiconductor region.

In the vertical neuromorphic devices stacked structure according to the first aspect, preferably, in the case where each of the control gate insulating layer stack and the main gate insulating layer stack is configured in a stack structure where a plurality of the layers including at least the charge storage layer and the insulating film are stacked, the charge storage layer is configured with an insulating film including traps or nano-sized particles, or an electrode material.

In the vertical neuromorphic devices stacked structure according to the first aspect, preferably, the control gate insulating layer stack includes a charge storage layer, and electric charges stored in the charge storage layer are controlled so that threshold voltage of FET formed in the control gate insulating stack is controlled.

In the vertical neuromorphic devices stacked structure according to the first aspect, preferably, the control gate insulating layer stack is configured in a stack structure including at least a charge storage layer and an insulating film, and each of the amount and the type of charges stored in the control gate insulating layer stack is controlled so that some of the control gates can be functioned as a switch which electrically isolates adjacent vertical neuromorphic devices from each other.

In the vertical neuromorphic devices stacked structure according to the first aspect, preferably, the control gate insulating layer stack and the main gate insulating layer stack are configured in a stack structure where a plurality of layers including at least a charge storage layer and an insulating film are stacked, and the charge storage layers are configured with materials of which dielectric constants are different from each other to be formed adjacently to each other, or the charge storage layers are configured to be electrically isolated by using insulating layers.

In the vertical neuromorphic devices stacked structure according to the first aspect, preferably, one of the charge storage layers of the control gate insulating layer stack and the main gate insulating layer stack is formed to contact to the semiconductor region, or one of the control gate and the main gate.

In the vertical neuromorphic devices stacked structure according to the first aspect, preferably, a single vertical neuromorphic device includes three adjacent electrode layers, two control gates between the electrode layers, respectively, control gate insulating layer stack surrounding the 2 control gates, respectively, a semiconductor region, a main gate insulating layer stack, and a main gate, and additional control gates disposed at both sides or one side of the 3 electrode layers in a vertical neuromorphic device are configured to function as a switch which electrically isolates adjacent vertical neuromorphic devices from each other by controlling charges stored in the charge storage layer of the control gate insulating layer stack.

In the vertical neuromorphic devices stacked structure according to the first aspect, preferably, a single vertical neuromorphic device includes two adjacent electrode layers, one control gate between the 2 electrode layers, one control gate insulating layer stack surrounding the control gate, a semiconductor region, a main gate insulating layer stack, and a main gate, and additional control gates disposed at both sides or one side of the 2 electrode layers in a vertical neuromorphic device are configured to function as a switch which electrically isolates adjacent vertical neuromorphic devices from each other by controlling charges stored in the charge storage layer of the control gate insulating layer stack.

According to a second aspect of the invention, there is provided an array comprising a plurality of vertical neuromorphic devices stacked structures, the vertical neuromorphic devices stacked structures are disposed on a single substrate, and the vertical neuromorphic devices stacked structures share control gates and electrode layers which are disposed in the same stacked layer and main gates of the vertical neuromorphic devices stacked structures are electrically isolated from each other.

In the array of vertical neuromorphic devices stacked structures according to the second aspect, preferably, 2 electrode layers disposed at both ends of a vertical neuromorphic device are configured to be connected to two independent paths of a current mirror circuit, respectively.

In the array of the vertical neuromorphic devices stacked structures according to the second aspect, preferably, the substrate is configured with an insulating material or semiconductor, in the case where the substrate is configured with an insulating material, the array further comprises a semiconductor layer under the substrate and the semiconductor layer includes peripheral devices and circuits for the array.

A vertical neuromorphic devices stacked structure according to the present invention is configured to include two MOS transistors including a common source and to read information stored in a charge storage layer enabling a memory function, so that the vertical neuromorphic device can imitate an excitation transmitting function of neurons and synapses. In addition, the vertical neuromorphic devices stacked structure according to the present invention is configured with a plurality of the vertical neuromorphic devices by using 3 dimensional stack structure, so that the area of neuromorphic devices can be reduced.

In addition, the two MOSFETs included in one vertical neuromorphic device in order to imitate one synapse are controlled to have different threshold voltages in a positive or negative region, and thus, when an input voltage to the vertical neuromorphic device is 0 V (or the synapse is not operated), no current flows, so that power consumption can be reduced.

In addition, the vertical neuromorphic device configured to include two MOSFETs can be controlled to have an excitatory or inhibitory functionality in a reconfigurable manner, so that the area of the vertical neuromorphic device can be efficiently used. In addition the vertical neuromorphic device according to the present invention can implement a spike timing dependent plasticity (STDP) function, a short term plasticity (STP) function, and long term plasticity (LTP) function as well as a memory function while occupying a small area. In addition, functions of a biological synapse are imitated on the basis of semiconductor FETs, and thus, selection elements causing problems in existing memrister-based techniques can be removed, so that durability and reliability can be greatly improved.

In comparison with existing vertical neuromorphic devices, according to the present invention, it is possible to provide a vertical neuromorphic device capable of imitating functions of neurons and synapses such as an excitation transmitting function, an excitation integrating/transmitting function, and excitatory and inhibitory functionalities and having excellent durability and a high degree of integration.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention is to provide a vertical neuromorphic devices stacked structure capable of effectively imitating a neuron circuit and having excellent durability and an excellent degree of integration. In particularly, since the vertical neuromorphic device is adjusted to have inhibitory or excitatory functionality according to a program or erase operation, the vertical neuromorphic device allows synapses and neutrons to be effectively embodied in terms of interconnections and area. Besides the inhibitory or excitatory functionality, the vertical neuromorphic device allows spike timing dependent plasticity (STDP), short term plasticity (STP), and long term plasticity (LTP) to be embodied in a small area. In addition, since a current does not flow in response to an input voltage corresponding to an off state, a low power configuration of the vertical neuromorphic devices stacked structure can be embodied.

The vertical neuromorphic devices stacked structure according to the present invention is configured to include a plurality of electrode layers, a plurality of control gates surrounded by control gate insulating layer stacks, a semiconductor region and a main gate, and the electrode layers and the control gates surrounded by the control gate insulating layer stack are stacked sequentially and alternately on the side surface of the semiconductor region Conceptually, the vertical neuromorphic devices stacked structure according to the present invention is configured to include two integrated FET elements which have one common source S and two drains, that is, first and second drains D1 and D2 which are electrically isolated from each other. The semiconductor region is configured to be channels of the FET devices. A main gate insulating layer stack is formed on at least one side of the semiconductor region, and the main gate insulating layer stack has a memory function. A main gate is formed on the other side of the main gate insulating layer stack and connects electrically the two integrated FET elements.

Hereinafter, the vertical neuromorphic devices stacked structure according to exemplary embodiments of the present invention will be described in detail with reference to the attached drawings.

Figure 1:
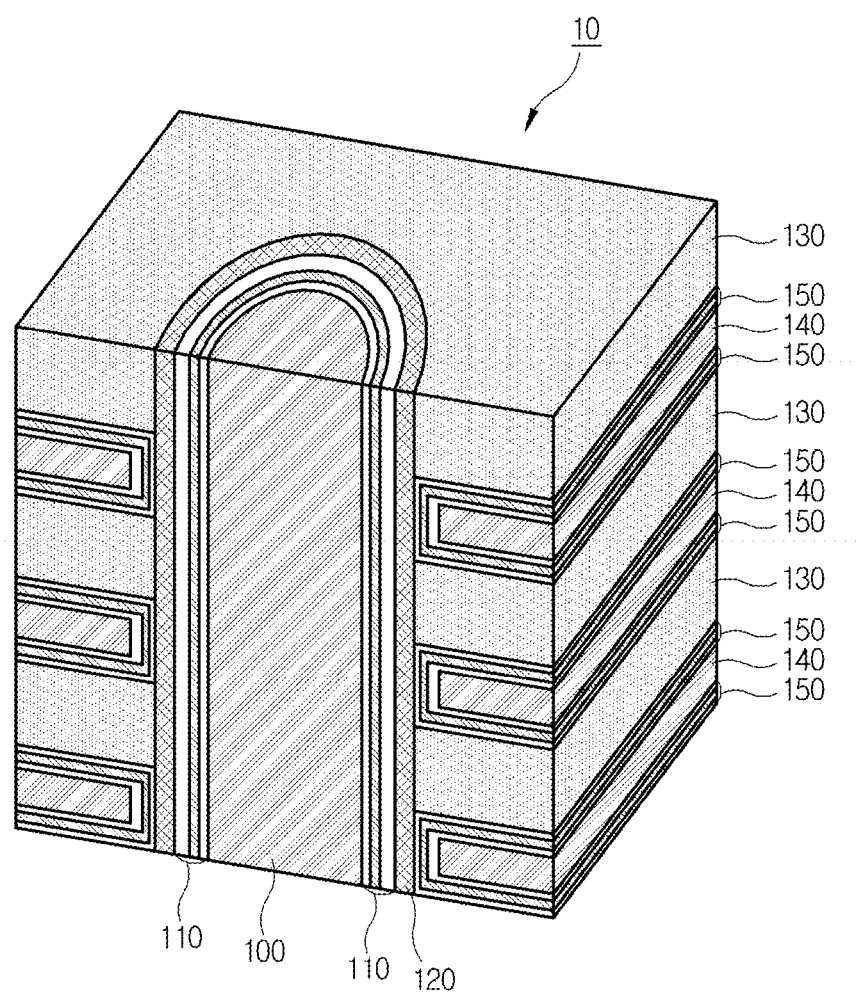
FIG. 1 is a perspective diagram illustrating a vertical neuromorphic devices stacked structure according to a first embodiment of the present invention.

FIG. 1 is a perspective diagram illustrating a vertical neuromorphic device stacked structure according to a first embodiment of the present invention.

Referring to FIG. 1, the vertical neuromorphic devices stacked structure 10 according to the embodiment is configured to include a main gate 100 which is formed on a substrate and has a vertical pillar shape, a main gate insulating layer stack 110 formed on outer side surface of the main gate 100, a semiconductor region 120 formed on outer side surface of the main gate insulating layer stack 110; a plurality of electrode layers 130 formed on the side surface of the semiconductor region 120, a plurality of control gates 140 formed on the side surface of the semiconductor region 120, and a plurality of control gate insulating layer stacks 150 which are surrounding surfaces of the control gates 140 and are formed between the control gate 140 and the semiconductor region 120 and between the control gate 140 and the electrode layer 130. The electrode layers 130 and the control gates 140 surrounded by the control gate insulating layer stack 150 are stacked sequentially and alternately on the side surface of the semiconductor region 120.

The aforementioned components of the vertical neuromorphic devices stacked structure 10 will be described more in detail.

As the substrate, a semiconductor substrate or an insulating film substrate such as a $SiO_2$ substrate may be used. If the substrate is configured with the insulating film, the structure further comprises a semiconductor layer which is disposed under the substrate and includes peripheral devices and circuits for the structure.

The main gate 100 is formed on a substrate and has a vertical pillar shape such as cylinder. The main gate 100 is configured with highly impurity-doped semiconductor or electrode material such as a metal, etc.

The control gate insulating layer stacks 150 are surrounding surfaces of the control gates 140, respectively, which are formed between the control gate 140 and the semiconductor region 120 and between the control gate 140 and the electrode layer 130. The control gate insulating layer stack 150 may be configured with a plurality of insulating films which are stacked and include a charge storage layer being capable of storing electric charges to fulfill a function as a nonvolatile memory. By controlling the type or the amount of the charges stored in the charge storage layer of the control gate insulating layer stack 150, the threshold voltage of FETs formed in the vertical neuromorphic devices stacked structure can be controlled.

The control gate insulating layer stack 150 may be configured in a stack structure where a plurality of the layers including at least a charge storage layer and an insulating film are stacked, the charge storage layer is configured with an insulating film including traps or nano-sized particles, or an electrode.

The main gate insulating layer stack 110 formed on outer side surface of the main gate 100 is configured with a insulating film or a plurality of insulating films, or in a stack structure where a plurality of layers including at least a charge storage layer and an insulating film are stacked. In the case where the main gate insulating layer stack 110 includes a charge storage layer and an insulating film, a program or erase operation is performed by injecting carriers (electrons or holes) from the main gate 100 or the semiconductor region. 120.

Each of the control gate insulating layer stack 150 and the main gate insulating layer stack 110 may be configured, for example, in a stack structure of a blocking insulating film, a charge storage layer, and a tunneling insulating film, in a stack structure of a charge storage layer and a tunneling insulating film, or in a stack structure of a blocking insulating film and a charge storage layer.

Each of the control gate insulating layer stack 150 and the main gate insulating layer stack 110 may be configured in a stack structure where a plurality of layers including at least a charge storage layer and an insulating film are stacked. In this case, the charge storage layers are configured with materials having different dielectric constants to be formed adjacently to each other, or the charge storage layers are configured to be electrically isolated from each other by using insulating layers.

One of the charge storage layers included in the control gate insulating layer stack 150 and the main gate insulating layer stack 110 is formed preferably to contact to the control gate 140 or one of the control gate 140 and main gate 100.

Referring to the control gate insulating layer stack 150, it is preferable that a region formed between the control gate 140 and the semiconductor region 120 is configured in a stack structure where a plurality of layers including at least a charge storage layer and an insulating film are stacked, and the other region is configured with a single insulating film or a plurality of insulating films and does not include a charge storage layer.

In the case that the main gate insulating layer stack 110 includes a charge storage layer, the charges of the charge storage layer may be provided or removed from the main gate 100 or the semiconductor region. 120.

The charge storage layers included in the control gate insulating layer stack 150 and the main gate insulating layer stack 110 may be configured so that the charge storing time periods thereof are different. Preferably, the structures and materials of the charge storage layers are set according to the charge storing time periods required for the charge storage layers.

The charge storage layer may be configured with any one selected from a nitride, a metal oxide, nano-sized particles, and conductive materials. For example, in the case where the Short Term Plasticity STP function of the vertical neuromorphic devices stacked structure is implemented by the main gate insulating layer stack 110, preferably, a leaky memory is configured by using the charge storage layer of which the charge storing time period is short. On the other hand, in the case where the Long Term Plasticity LTP function of the vertical neuromorphic devices stacked structure is implemented by the main gate insulating layer stack 110, preferably, a permanent memory is configured by using the charge storage layer of which the charge storing time period is long. This can be reconfigured freely according to the application of the device.

In addition, in the case where the charge storage layers included in the control gate insulating layer stack 150 and the main gate insulating layer stack 110 are configured in a stack structure of which a plurality of layers including a charge storage layer and a tunneling insulating film are stacked, the charge storage layer may be configured with a insulating film having traps or nano-sized particles, or an electrode.

In addition, the charge storage layer may be formed as a single layer or in a stack structure of two or more layers configured with materials having different dielectric constants or materials having different depths of traps for storing electric charges. Preferably, the charge storage layer is formed as two or more layers configured with materials having different dielectric constants, so that a short-term memory for storing data in a short term and a long-term memory for storing data in a long term can be simultaneously implemented. In the case where the charge storage layer is configured with two layers, the short-term memory may be implemented in the lower layer, and the long-term memory may be implemented in the upper layer. By adjusting pulse size or width and the number of pulses in a program or erase operation, the short-term and long-term memories can be implemented.

The amount of electric charges stored in the charge storage layer of the main gate insulating layer stack 110 can be detected and copied to be stored in the charge storage layer of the control gate insulating layer stack 150. By using this configuration, as an example, information stored in the charge storage layer of the main gate insulating layer stack 110 configured for the short-term memory and the STDP function can be stored in the charge storage layer of the control gate insulating layer stack 150 configured for permanently storing electric charges. In other words, results of learning can be periodically and permanently stored in a storage device.

In the case where the control gate insulating layer stack 150 is configured in a stack structure including at least a charge storage layer, the amount and the type of the charges stored in the control gate insulating layer stack surrounding some of the control gates 140 can be controlled, so that the some of the control gates 140 can be configured to fulfill a function as a switch which isolates electrically the adjacent electrode layers from each other.

The electrode layers 130 formed on the side surface of the semiconductor region 120, may be configured with semiconductor electrode layer of which the impurity-type is same, or with semiconductor electrode layers of which the impurity-type is different from each other (for example p-type and n-type) to be disposed alternately. Particularly, in the case where the electrode layers 130 are configured with semiconductor electrode of which the impurity-type is different from each other to be disposed alternately, the vertical neuromorphic device can be operated as a TFET or a gated diode.

On the other hand, in the case where the electrode layers 130 are configured with semiconductor of which the impurity-type is same, preferably, the vertical neuromorphic device stacked structure further includes a doping region formed on the side surface of the semiconductor region 120. The doping region may be configured with impurity-doped semiconductor of which the impurity-type is different from that of the electrode layer.

In addition, in the case where the electrode layers 130 are configured with semiconductor electrode layers of which the impurity-type is same, preferably, the semiconductor region 120 is configured to be doped with impurity of which the impurity type is different from that of the electrode layer.

The electrode layers 130 and the control gates 140 are configured to be stacked sequentially and alternately, and the control gate insulating layer stacks 150 are disposed between the control gate 140 and the semiconductor region 120 and between the control gate 140 and the electrode layer 130.

The semiconductor region 120 is formed on the side surface of the control gate insulating layer stacks 150 and is connected to the side surfaces of the adjacent electrode layers, so that the semiconductor region 120 is operated as a channel in FET device.

Figure 2:
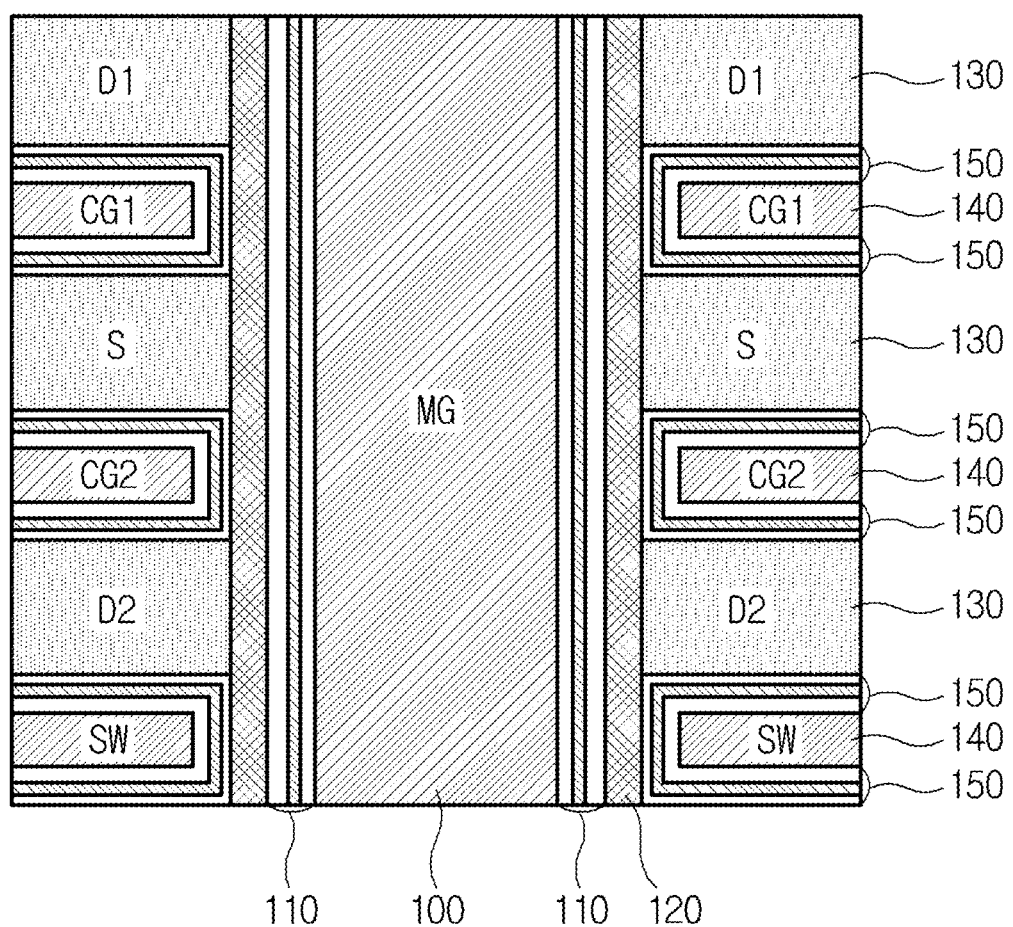
FIG. 2 is a conceptual diagram illustrating a single vertical neuromorphic device including two FETs in the vertical neuromorphic devices stacked structure according to the first embodiment of the present invention.

FIG. 2 is a conceptual diagram illustrating a single vertical neuromorphic device including two FETs in the vertical neuromorphic devices stacked structure according to the first embodiment of the present invention.

Referring to FIG. 2, a single vertical neuromorphic device includes three adjacent electrode layers, two control gates disposed between the electrode layers, respectively, two control gate insulating layer stacks surrounding the 2 control gates, respectively, a semiconductor region, a main gate insulating layer stack, and a main gate. In addition, additional control gates disposed at both side or one side of the 3 electrode layers in a vertical neuromorphic device are configured to function as a switch which electrically isolates the adjacent vertical neuromorphic devices from each other by controlling electric charges stored in the charge storage layer of the control gate insulating layer stack.

For the convenience of description, the three electrode layers are described as first, second and third electrode layers, respectively, and the two control gates are described as first and second control gates CG1 and CG2, respectively. The first and third electrode layers are configured to be the first and second drains D1 and D2, respectively, and the second electrode layer is configured to be a common source S. The semiconductor region formed on the side surface of the first and second control gates functions as channels of the FET devices. Accordingly, the vertical neuromorphic device according to the present invention forms the merged structure of two FET devices which have a common source S and two drains D1 and D2 isolated electrically from each other.

The semiconductor region forming a channel is disposed between the common source S and the first drain D1 and between the common source S and the second drain D2. The main gate insulating layer stack and the control gate insulating layer stack are disposed at both side surfaces, respectively, and may be operated as a memory. The main gate being a gate electrode is formed one side surface of the main gate insulating layer stack and is configured to be connected electrically to the two merged FET devices.

The aforementioned vertical neuromorphic device stacked structure according to the embodiment of the present invention can be programmed and erased for each device by using the control gate and the main gate.

In the vertical neuromorphic device stacked structure according to the present invention, functions of the devices can be reconfigured by using the above-described programming and erasing procedure. As a result, excitatory and inhibitory functionalities can be set for each vertical neuromorphic device.

The vertical neuromorphic device according to the present invention having the above-described configuration is configured with two nMOSFETs. Now, the implementation of the excitatory and inhibitory functionalities in the vertical neuromorphic device is described.

Figure 4:
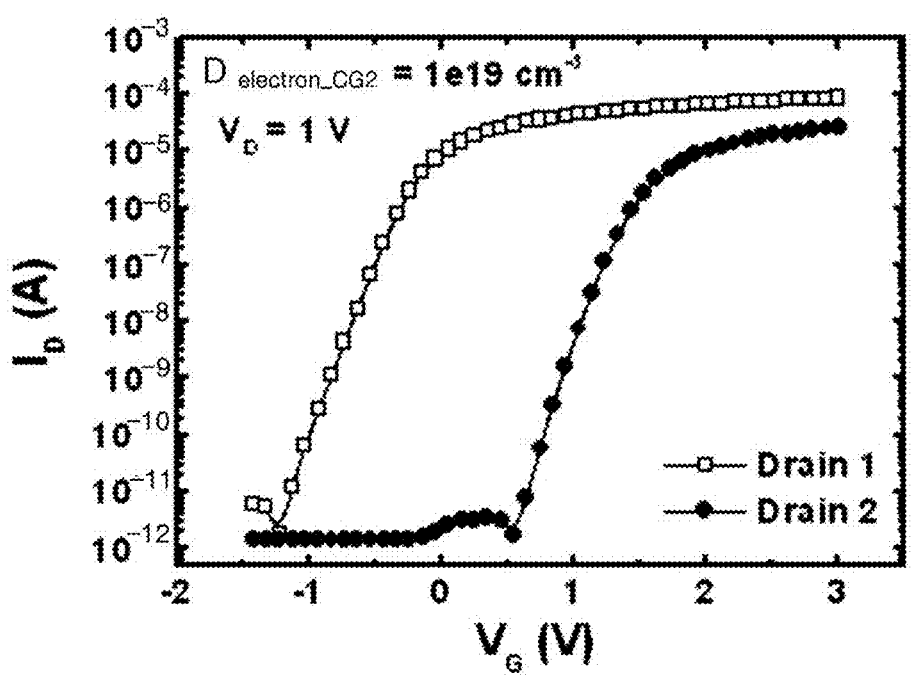
FIG. 4 is a graph illustrating current-voltage characteristics between a common source S and two drains D1 and D2 in one vertical neuromorphic device based on two n-type MOSFETs in the case where a threshold voltage of a channel between the source and the drain D1 is low.

FIG. 4 is a graph illustrating current-voltage characteristics between a common source S and two drains D1 and D2 in one vertical neuromorphic device based on two n-type MOSFETs in the case where a threshold voltage of a channel between the source and the drain D1 is low.

Referring to FIG. 4, if the vertical neuromorphic device configured with, for example, two nMOSFETs is programmed through the second control gate CG2, the threshold voltage is increased, so that small current or no current flows through the channel formed on the second control gate CG2 in the read operation. On the contrary, large current flows through the channel formed on the control gate CG1 since the threshold voltage is low. Therefore, the vertical neuromorphic device which is set in this manner can be defined to have excitatory or inhibitory functionality. For example, the above case is defined as the excitatory functionality. Namely, in the vertical neuromorphic device which is set to have the excitatory functionality, relatively large current can be flowed from the first drain D1 as the first electrode layer to the source S as the second electrode layer.

Figure 5:
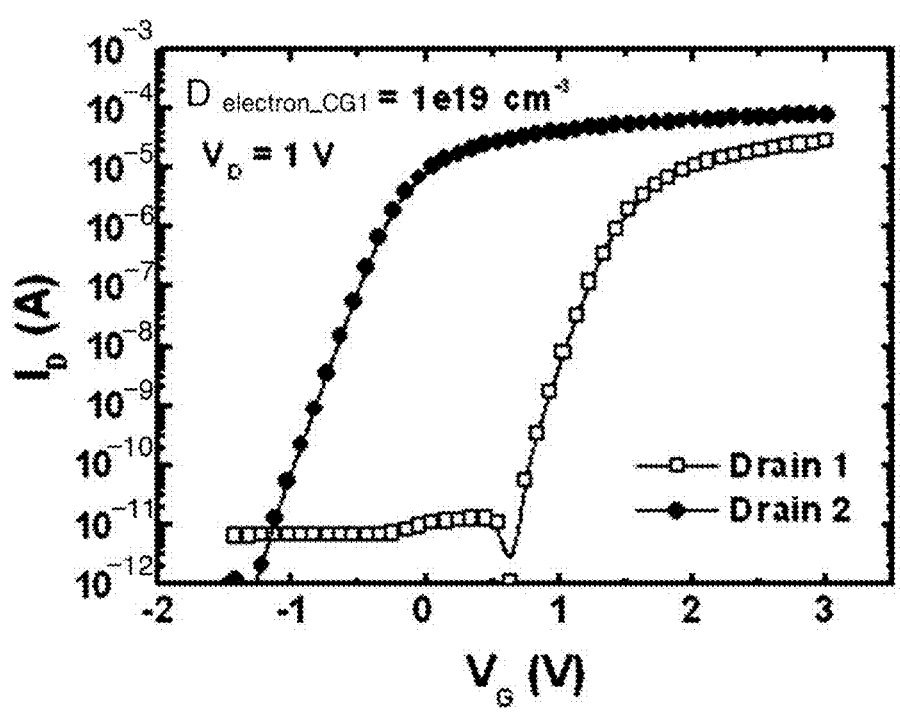
FIG. 5 is a graph illustrating current-voltage characteristics between a common source S and two drains D1 and D2 in one vertical neuromorphic device based on two n-type MOSFETs in the case where a threshold voltage of a channel between the source and the drain D2 is low.

FIG. 5 is a graph illustrating current-voltage characteristics between a common source S and two drains D1 and D2 in one vertical neuromorphic device based on two n-type MOSFETs in the case where a threshold voltage of a channel between the source and the drain D2 is low.

Referring to FIG. 5, if the vertical neuromorphic device configured with, for example, two nMOSFETs is programmed through the first control gate CG1, the threshold voltage is increased, so that small current or no current flows through the channel formed on the first control gate in the read operation. On the contrary, large current flows through the channel formed on the second control gate since the threshold voltage is low. Therefore, the vertical neuromorphic device which is set in this manner can be defined to have excitatory or inhibitory functionality. For example, the above case is defined as the inhibitory functionality. Namely, in the vertical neuromorphic device which is set to have the inhibitory functionality, relatively large current can be flowed from the second drain D2 as the third electrode layer to the source as the second electrode layer.

Each of the vertical neuromorphic devices according to the embodiments having the above-described configuration is configured with two nMOSFETs. The specified vertical neuromorphic device can be set to have excitatory or inhibitory functionality as described above. Besides, the threshold values of both of the two nMOSFETs in the specified vertical neuromorphic device are increased, and thus, in the read operation, the two elements can be maintained in the OFF state. On the contrary, if the threshold voltages are allowed to be decreased, both of the two elements can be maintained in the ON state.

For the convenience of description, it is assumed that one vertical neuromorphic device includes two nMOSFETs. The vertical neuromorphic device can be configured with two pMOSFETs to be set to have the excitatory or inhibitory functionality, and both of the two pMOSFETs may be set to OFF or ON.

The vertical neuromorphic devices stacked structure according to the embodiments having the above-described configuration can be configured in a form of an array, a plurality of vertical neuromorphic devices are in the vertical neuromorphic devices stacked structure, and thus, a plurality of the vertical neuromorphic devices are disposed in the array. Each of the vertical neuromorphic devices can be set to be in one of excitatory, inhibitory, OFF, and ON states as described above.

In the case where a plurality of vertical neuromorphic devices are in the vertical neuromorphic devices stacked structure, the control gate disposed between the adjacent vertical neuromorphic devices is operated as a switch, and thus each vertical neuromorphic device in the vertical neuromorphic devices stacked structure can be isolated electrically from each other. Each vertical neuromorphic device can be set to be in one of excitatory, inhibitory, OFF, and ON states as described above.

In addition, each of the vertical neuromorphic devices according to the embodiments can have inhibitory or excitatory functionality. In addition, since the main gate insulating layer stack on the side surface of the semiconductor region can be programmed or erased by comparing a presignal applied to the gate of the vertical neuromorphic device and a post-signal fed back to the body (body contact) and the source through the neuron circuit, the spike timing dependent plasticity (STDP) function of adjusting the weighting factor of the vertical neuromorphic device can be implemented. In addition, due to the process, in the vertical neuromorphic device according to the present invention, the short-term plasticity (STP) function and the long-term plasticity (LTP) function can be implemented. Due to these functions, the vertical neuromorphic device can perform learning. These functions can be implemented in a small area with reliability.

Figure 3:
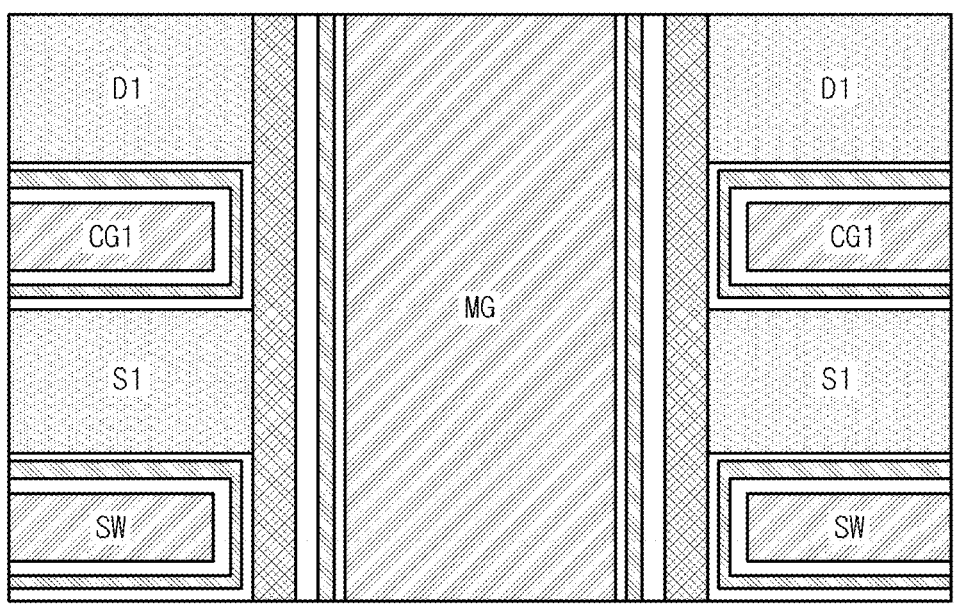
FIG. 3 is a conceptual diagram illustrating a single vertical neuromorphic device including one FET in the vertical neuromorphic devices stacked structure according to the first embodiment of the present invention.

FIG. 3 is a conceptual diagram illustrating a single vertical neuromorphic device including one FET in the vertical neuromorphic devices stacked structure according to the first embodiment of the present invention;

Referring to FIG. 3, a single vertical neuromorphic device includes two adjacent electrode layers, one control gates disposed between the electrode layers, one control gate insulating layer stack surrounding the control gate, a semiconductor region, a main gate insulating layer stack, and a main gate. In addition, additional control gates disposed at both sides or one side of the 2 electrode layers in a vertical neuromorphic device are configured to function as a switch which electrically isolates adjacent vertical neuromorphic devices from each other by controlling charges stored in the charge storage layer of the control gate insulating layer stack.

<Array for Vertical Neuromorphic Devices Stacked Structure>

Figure 6:
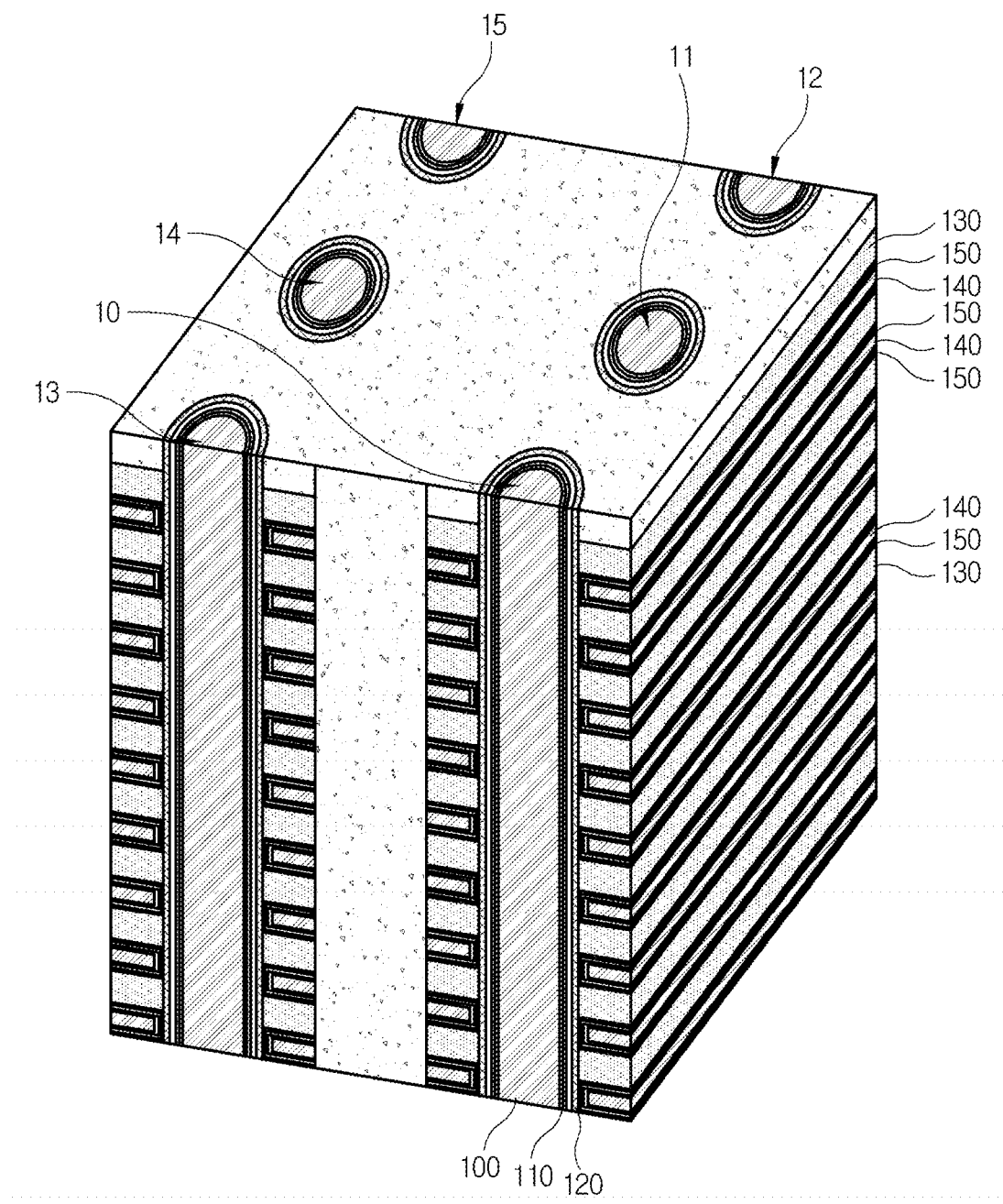
FIG. 6 is a perspective diagram illustrating a configuration of an array of the vertical neuromorphic devices stacked structure according to the second embodiment of the present invention.

FIG. 6 is a perspective diagram illustrating a configuration of an array of the vertical neuromorphic devices stacked structure according to the second embodiment of the present invention;

Referring to FIG. 6, the array according to the present invention includes a plurality of the vertical neuromorphic devices stacked structures 10, 11, 12, 13, 14 and 15, the vertical neuromorphic devices stacked structures 10, 11, 12, 13, 14 and 15 may share the control gates and electrode layers disposed in the same stacked layer and may be connected to each other by using the main gates being isolated electrically from each other.

Figure 7:
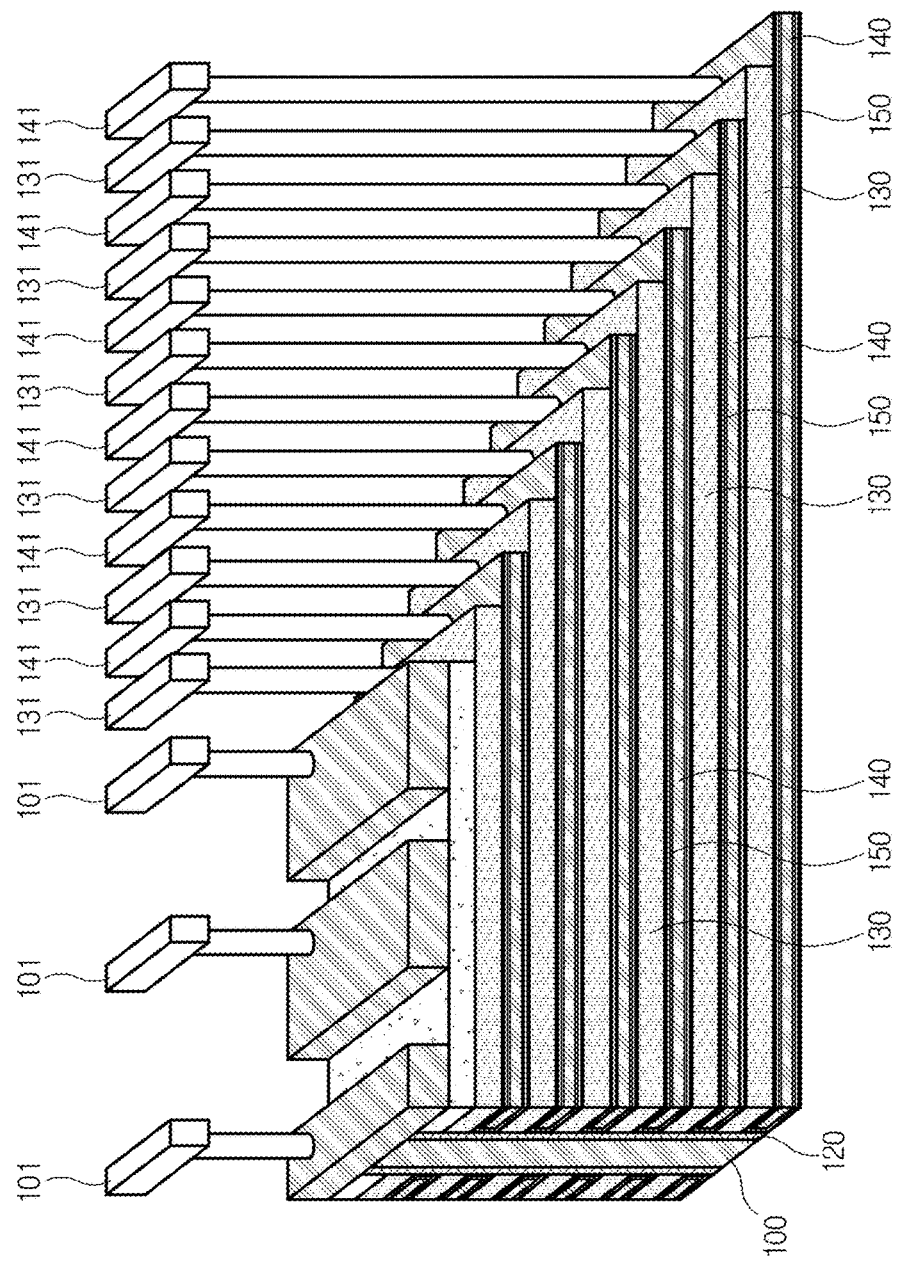
FIG. 7 is a perspective diagram illustrating an embodiment of electrical contacts to the main gate 100, electrode layer 130, and control gate 140 in the array of the vertical neuromorphic devices stacked structure according to the present invention.

FIG. 7 is a perspective diagram illustrating an embodiment of electrical contacts to the main gate 100, electrode layer 130, and control gate 140 in the array of the vertical neuromorphic devices stacked structure according to the present invention;

Referring to FIG. 7, in the array according to the present invention, the main gate electrode 101 is connected at the top of the main gate 100, and the electrode layers 130 and control gates 140 are connected to the electrodes 131 and 141, respectively, outer region of the array.

Figure 8A:
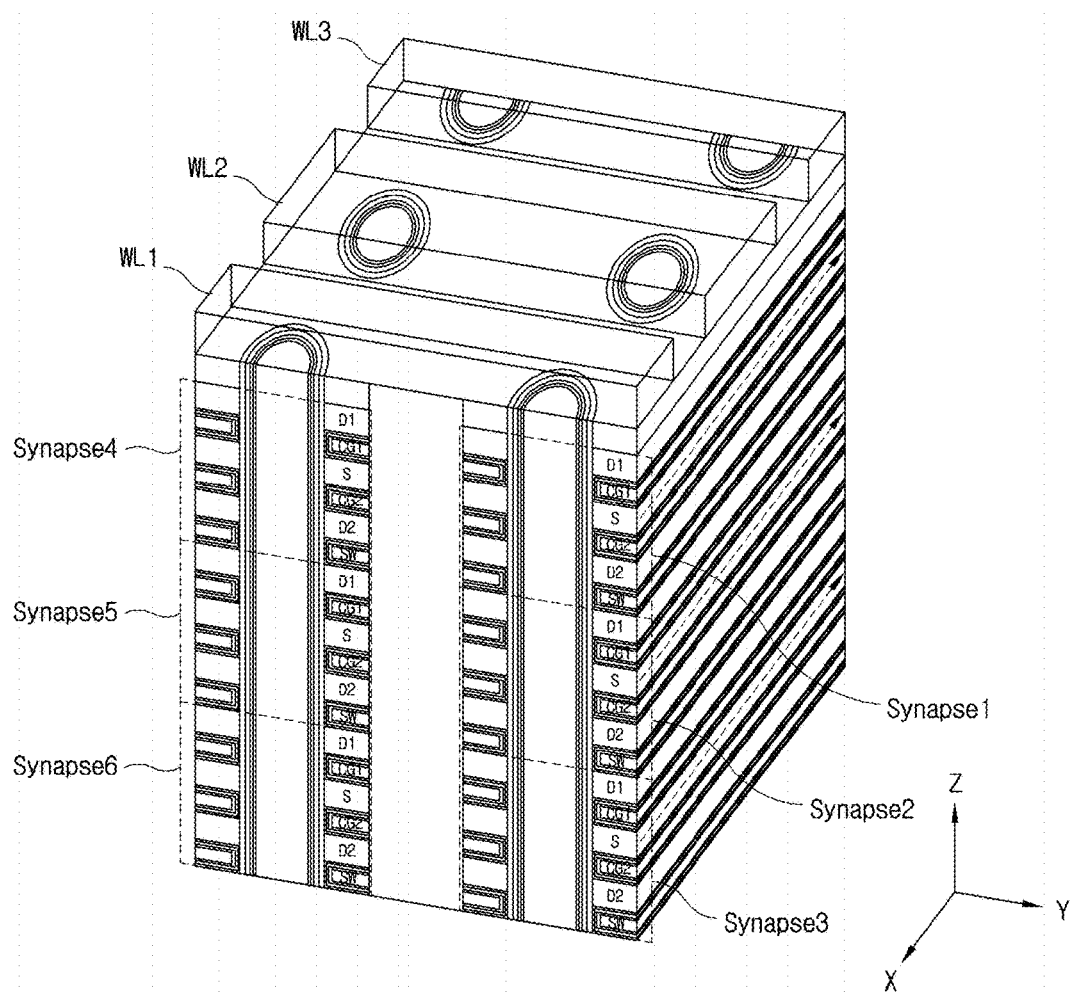
FIG. 8A is a perspective diagram illustrating the array of the vertical neuromorphic devices stacked structure according to the present invention of which the vertical neuromorphic device is configured with two n-MOSFETs.
Figure 8B:
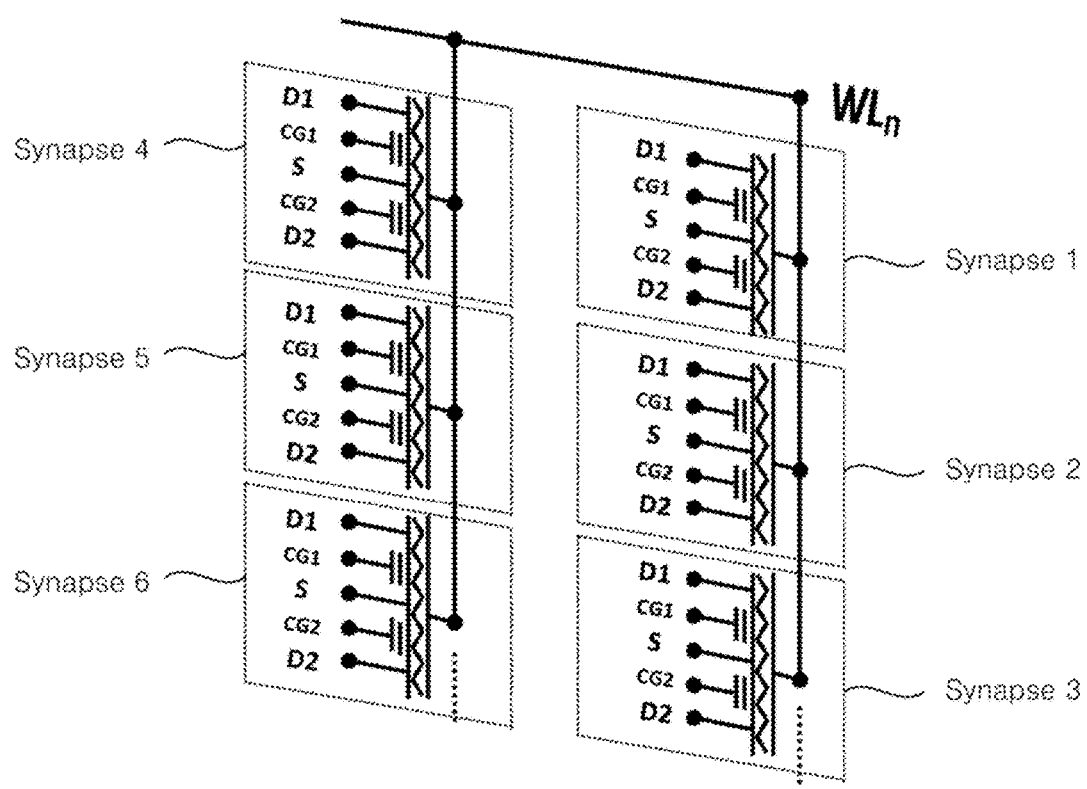
FIG. 8B is a circuit diagram illustrating the array of the FIG. 8A.

FIG. 8A is a perspective diagram illustrating the array of the vertical neuromorphic devices stacked structures according to the present invention of which the vertical neuromorphic device is configured with two n-MOSFETs. FIG. 8B is a circuit diagram illustrating the array of the FIG. 8A.

Referring to FIGS. 8A and 8B, in the array according to the present invention, the single vertical neuromorphic devices stacked structure has three vertical neuromorphic devices Synapse 1, Synapse 2 and Synapse 3, and the devices include a first and a second drains D1 and D2, source S, a first and s second control gates CG1 and CG2, and a switch SW.

In the array according to the present invention, a plurality of the vertical neuromorphic devices stacked structures disposed according to X-axis direction are configured to be shared the electrode layer, control gate insulating layer stack, and control gate of each stacked layer, and a plurality of the vertical neuromorphic devices stacked structures disposed according to Y-axis direction are configured to be shared the word lines Wl1, WL2 and WL3 connecting the main gates.

Figure 9A:
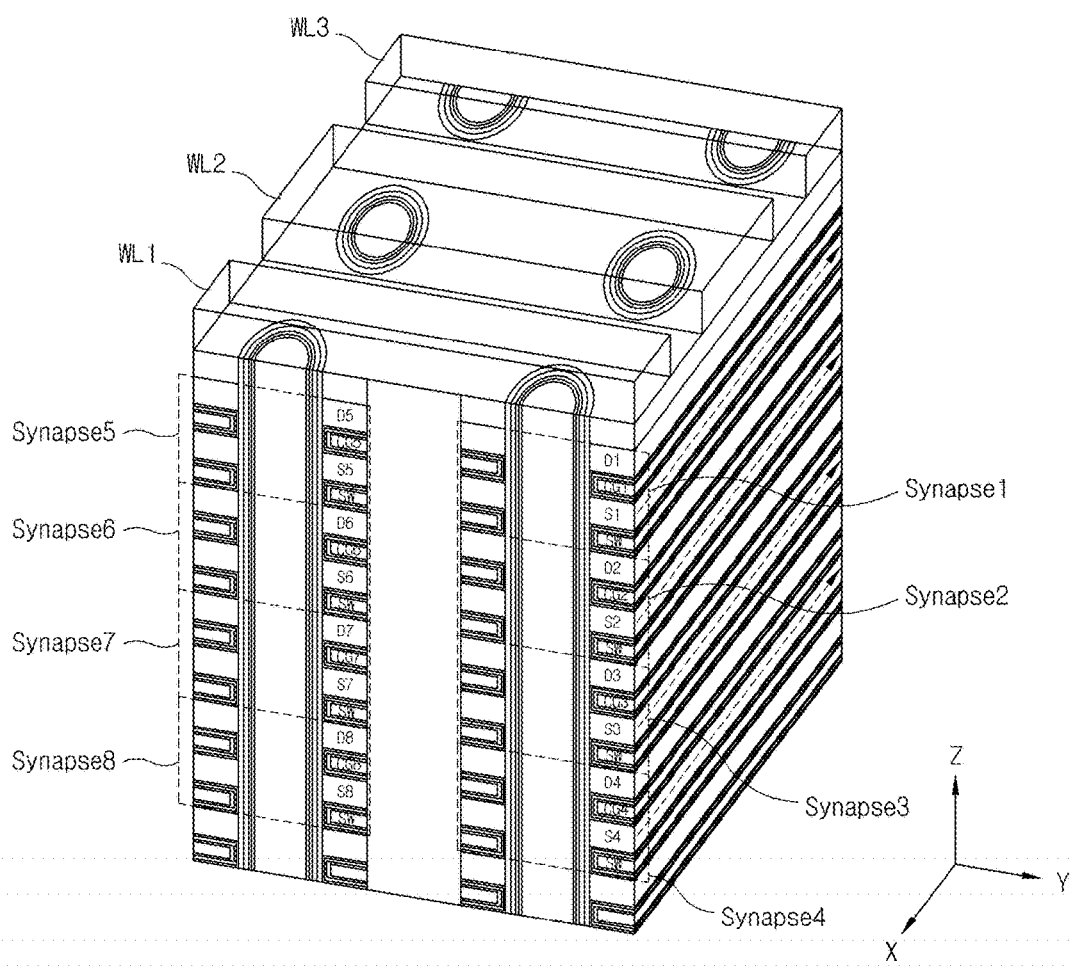
FIG. 9A is a perspective diagram illustrating the array of the vertical neuromorphic devices stacked structure according to the present invention of which the vertical neuromorphic device is configured with one n-MOSFET.
Figure 9B:
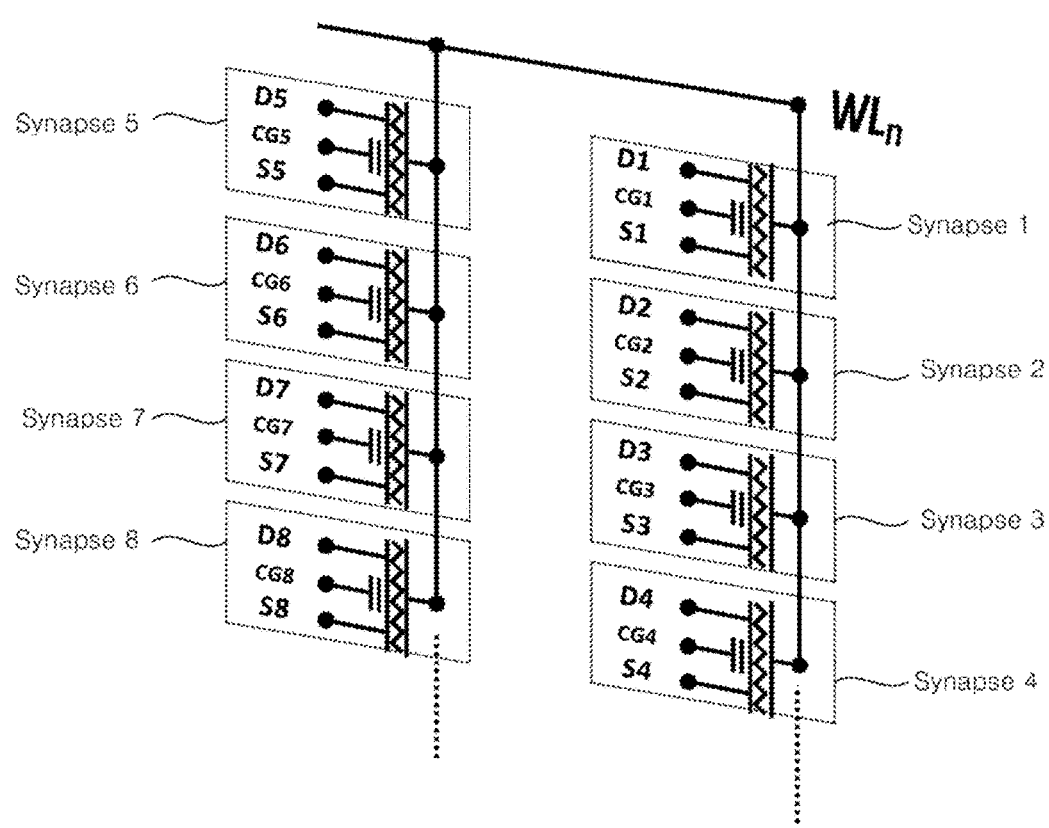
FIG. 9B is a circuit diagram illustrating the array of the FIG. 9A.

FIG. 9A is a perspective diagram illustrating the array of the vertical neuromorphic devices stacked structure according to the present invention of which the vertical neuromorphic device is configured with one n-MOSFET. FIG. 9B is a circuit diagram illustrating the array of the FIG. 9A.

Referring to FIGS. 9A and 9B, in the array according to the present invention, the single vertical neuromorphic devices stacked structure has four vertical neuromorphic devices Synapse 1, Synapse 2, Synapse 3 and Synapse 4, and the devices include a drain D, source S, a control gate CG and a switch SW, respectively.

Figure 10:
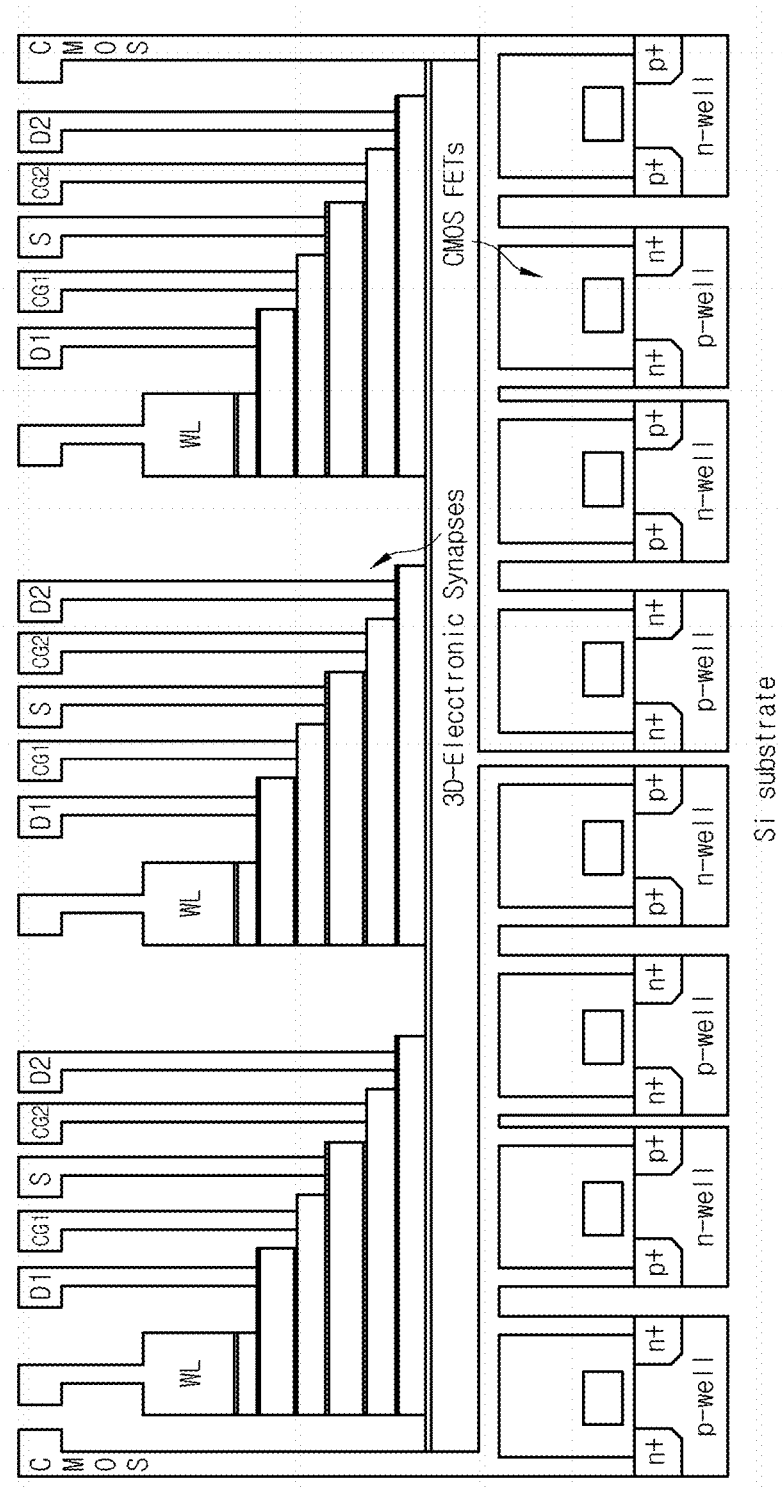
FIG. 10 is a cross-sectional diagram illustrating additional circuits disposed on the substrate in the array of the vertical neuromorphic devices stacked structure according to the present invention.

FIG. 10 is a cross-sectional diagram illustrating additional circuits disposed on the substrate in the array of the vertical neuromorphic devices stacked structure according to the present invention;

Referring to FIG. 10, in the array according to the present invention, the substrate for the array is configured to be a semiconductor substrate or an insulating film substrate such as a $SiO_2$ substrate may be used. If the substrate is configured with the insulating film, a semiconductor layer may be disposed under the substrate and the semiconductor layer may include peripheral devices and circuits for the structure.

In the array of vertical neuromorphic devices stacked structures according to the second aspect, preferably, 2 electrode layers disposed at both ends of a vertical neuromorphic device in the vertical neuromorphic devices stacked structure are preferably formed to be connected to two respective independent paths of a current mirror circuit.

Figure 11:
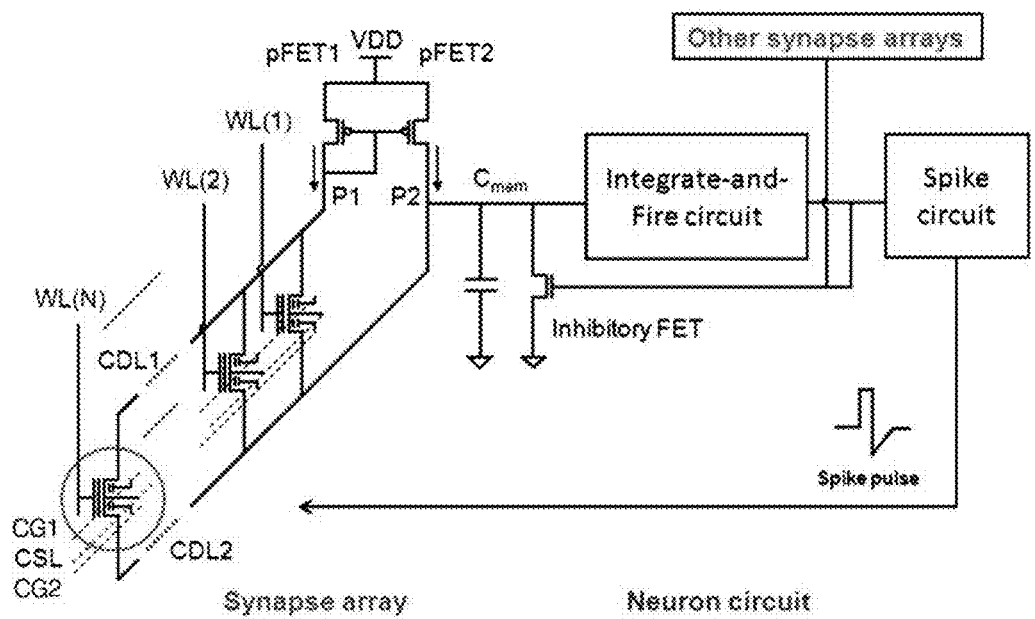
FIG. 11 is a circuit diagram illustrating a configuration where the vertical neuromorphic device array and a neuron circuit through a current mirror circuit in the array of the vertical neuromorphic devices stacked structure according to the present invention.

FIG. 11 is a circuit diagram illustrating a configuration where the vertical neuromorphic device array and a neuron circuit through a current mirror circuit in the array of the vertical neuromorphic devices stacked structure according to the present invention.

In each vertical neuromorphic device, the first electrode layer (drain 1) and the third electrode layer (drain 2) are connected to the first common drain line (CDL1) and the second common drain line (CDL2) in the array, respectively. In addition, the second electrode layer (source) is connected to the common source line (CSL) in the array. In addition, the main gates of the vertical neuromorphic devices in the array are denoted by a plurality of the upper electrodes (word lines WL(1) . . . WL(N)). The first drain line of the array is connected to the path 1 (P1) of the current mirror circuit. The second common drain line is connected to a node to which the path 2 (P2) of the current mirror circuit and one terminal of the capacitor (charge storage unit) are connected. When the current flowing through the first drain line is denoted by I1, the current I1 flows through the path 1 of the current mirror circuit. Assuming that the current of the path 1 is copied to the path 2 in a one-to-one manner, the current of the path 2 also becomes I1. When the current flowing through the second drain line is denoted by I2, the current of I1-I2 is flowed in to the electrode connected to the capacitor. If the current I1 is larger than the current I2, the capacitor voltage is increased. If the current I1 is smaller than the I2, the capacitor voltage is decreased. If the voltage of the charge storage unit exceeds a threshold value, the neuron circuit generates a spiking signal to transmit the signal to the next synapse. In addition, the spiking signal generated in the neuron circuit is fed back to the semiconductor region and the source, so that the weighting factor of the specified vertical neuromorphic device in the STDP operation can be changed. As mentioned above, the first control gate (CG1) and the second control gate (CG2) set the programming state of the two nMOSFETs and adjust the currents of the two nMOSFETs to set the corresponding neuromorphic device as excitatory or inhibitory.

When the inhibitory FET receives signals from other arrays, the inhibitory FET makes the charges stored in the capacitor Cmem discharge according to the signal.

Since the vertical neuromorphic devices stacked structure according to the present invention has a small occupation area, it is possible to increase a degree of integration. The vertical neuromorphic device has a reliability based on silicon techniques. Since various functions required for a neuromorphic technique can be implemented, the vertical neuromorphic device according to the present invention can be widely used in the field of the neuromorphic technique.

While the present invention has been particularly shown and described with reference to exemplary embodiments thereof, it will be understood by those skilled in the art that various changes and modifications in form and details may be made therein without departing from the spirit and scope of the present invention as defined by the appended claims.

What is claimed is:

1. A vertical neuromorphic devices stacked structure comprising:
   a main gate formed on a substrate and having a vertical pillar shape;
   a main gate insulating layer stack formed vertically on an outer vertical surface of the main gate;
   a semiconductor region formed vertically on an outer vertical surface of the main gate insulating layer stack;
   a plurality of electrode layers formed on an outer vertical surface of the semiconductor region, the electrode layers being apart from each other along the outer vertical surface of the semiconductor region;
   a control gate formed between two neighboring electrode layers; and
   a control gate insulating layer stack formed between the semiconductor region and the control gate and between the control gate and the two neighboring electrode layers in such a way that the control gate is insulated from the semiconductor region and the two neighboring electrode layers.

2. The vertical neuromorphic devices stacked structure according to claim 1, wherein the main gate insulating layer stack is formed of a single insulating material, or formed of a plurality of layers including at least one charge storage layer and an insulating film.

3. The vertical neuromorphic devices stacked structure according to claim 1, wherein the control gate insulating layer stack formed between the control gate and the semiconductor region is formed of a plurality of layers including at least one charge storage layer and an insulating film.

4. The vertical neuromorphic devices stacked structure according to claim 1, wherein each of the control gate insulating layer stack and the main gate insulating layer stack is formed of a plurality of layers including at least one charge storage layer and an insulating film, and
wherein the at least one charge storage layer of the control gate insulating layer stack is formed of a material having a dielectric constant different from that of the main gate insulating layer stack, or the at least one charge storage layer of the control gate insulating layer stack has a charge storage duration different from that of the main gate insulation.

5. The vertical neuromorphic devices stacked structure according to claim 1, wherein the electrode layers are formed of semiconductor electrodes doped with impurities, and an impurity-type of the two neighboring electrode layers is opposite to each other.

6. The vertical neuromorphic devices stacked structure according to claim 1, wherein the electrode layers are formed of semiconductor electrodes doped with impurities, and an impurity-type of the two neighboring electrode layers is same.

7. The vertical neuromorphic devices stacked structure according to claim 1, wherein the electrode layers are doped with impurities, and an impurity-type of the two neighboring electrode layers is same, and
wherein the semiconductor region is doped with impurity of which an impurity-type is opposite to that of the electrode layers.

8. The vertical neuromorphic devices stacked structure according to claim 1, wherein the control gate insulating layer stack includes a charge storage layer, and
wherein charges stored in the charge storage layer are controlled so that threshold voltage of a FET (Field Effect Transistor) consisting of the control gate, the control gate insulating layer stack, two electrodes adjacent the control gate, and the semiconductor region is controlled.

9. The vertical neuromorphic devices stacked structure according to claim 1, wherein the control gate insulating layer stack includes at least one charge storage layer and at least one insulating film, and
wherein an amount and type of charges stored in the control gate insulating layer stack is controlled so that the control gate functions as a switch which electrically isolates vertically adjacent vertical neuromorphic devices from each other.

10. The vertical neuromorphic devices stacked structure according to claim 1, wherein the control gate insulating layer stack or the main gate insulating layer stack is formed of a plurality of layers including two charge storage layers and at least one insulating film, and
wherein the charge storage layers are formed to be in contact with each other or separated from each other by an insulating layer.

11. The vertical neuromorphic devices stacked structure according to claim 1, wherein the electrode layers include three sequential electrode layers.

12. The vertical neuromorphic devices stacked structure according to claim 1, wherein the electrode layers include two electrode layers.

13. An array comprising a plurality of vertical neuromorphic devices stacked structures according to claim 1, wherein the vertical neuromorphic devices stacked structures are disposed on a single substrate, and
wherein the vertical neuromorphic devices stacked structures share the control gate and the electrode layers of a same stacked layer, and the main gates of the vertical neuromorphic devices stacked structures are electrically isolated from each other.

14. The vertical neuromorphic devices stacked structure according to claim 2, wherein a program or erase operation is performed by injecting carriers (electrons or holes) to the at least one charge storage layer from the main gate or the semiconductor region.

15. The vertical neuromorphic devices stacked structure according to claim 5, wherein each of the control gate insulating layer stack and the main gate insulating layer stack is formed of a plurality of layers including at least one charge storage layer and an insulating film, and the at least one charge storage layer is formed of an insulating film including traps or nano-sized particles, or an electrode.

16. The vertical neuromorphic devices stacked structure according to claim 10, wherein one of the charge storage layers of the control gate insulating layer stack contacts to the semiconductor region or the control gate, or one of the main gate insulating layer stack contacts to the semiconductor region or the main gate.

17. The vertical neuromorphic devices stacked structure according to claim 11, further including two additional control gates disposed at both sides or an additional control gate disposed at one side of the three electrode layers,
wherein the additional control gate is configured to function as a switch which electrically isolates vertically adjacent vertical neuromorphic devices from each other by controlling charges stored in a charge storage layer of the control gate insulating layer stack.

18. The vertical neuromorphic devices stacked structure according to claim 12, further including two additional control gates disposed at both sides or an additional control gate disposed at one side of the two electrode layers,
wherein the additional control gate is configured to function as a switch which electrically isolates vertically adjacent vertical neuromorphic devices from each other by controlling charges stored in a charge storage layer of the control gate insulating layer stack.

19. The array comprising a plurality of vertical neuromorphic devices stacked structures according to claim 13, wherein two additional electrode layers disposed at both ends of a vertical neuromorphic device in the vertical neuromorphic devices stacked structure are formed to be connected to two independent paths of a current mirror circuit, respectively.

20. The array comprising a plurality of vertical neuromorphic devices stacked structures according to claim 13, wherein the single substrate is formed of an insulating material or a semiconductor, in the case where the single substrate is configured with an insulating material, a semiconductor layer is formed under the single substrate and the semiconductor layer includes peripheral devices and circuits for the array.

* * * * *